United States Patent [19]
Wynns et al.

[11] Patent Number: 5,873,951
[45] Date of Patent: Feb. 23, 1999

[54] DIFFUSION COATED ETHYLENE FURNACE TUBES

[75] Inventors: Kim A. Wynns, Spring, Tex.; George T. Bayer, Tarentum, Pa.

[73] Assignee: Alon, Inc., Tarentum, Pa.

[21] Appl. No.: 702,175

[22] Filed: Aug. 23, 1996

[51] Int. Cl.$^6$ .............................. C23C 22/70; B05D 1/36
[52] U.S. Cl. ............................................ 148/242; 427/205
[58] Field of Search ................................ 148/242; 419/9; 427/205, 405

[56] References Cited

U.S. PATENT DOCUMENTS

| | | | |
|---|---|---|---|
| 4,004,047 | 1/1977 | Grisik | 427/142 |
| 4,310,574 | 1/1982 | Deadmore et al. | 427/405 |
| 4,500,364 | 2/1985 | Krutenat | 148/6.14 |
| 4,904,301 | 2/1990 | Davis | 427/253 |
| 5,135,777 | 8/1992 | Davis et al. | 148/6.14 |

FOREIGN PATENT DOCUMENTS

| | | |
|---|---|---|
| 810 647 A | 5/1974 | Belgium . |
| 1 049 330 A | 12/1953 | France . |
| 54090030 | 7/1979 | Japan . |
| 80029151 | 8/1980 | Japan . |
| 9302440 | 4/1993 | Rep. of Korea . |
| WO 82/03027 A | 9/1982 | WIPO . |

OTHER PUBLICATIONS

Patent Abstract of Japan, vol. 012, No. 015 (C–469), Jan. 16, 1988, of Japanese Patent Application No. 61013372, published Jul. 27, 1987.

Reprint from Oil & Gas Journal, "Aluminized ethylene furnace tubes extend operating life," Reprinted from the Aug. 31, 1987 edition of Oil & Gas Journal, Copyright 1987 by PennWell Publishing Company.

"A Study Of The Results Of 3½ Years of Exposure Of Alonzied Tubes In An Ethylene Pyrolysis Furnace," Nov., 1984.

"Use alloys to improve ethylene proudction," Hydrocarbon Processing, Mar., 1996, pp. 53–61.

"Update in Alloy Selection for Ethylene Furnaces" by Steanson B. Parks and C. M. Schillmoller, A.I.Ch.E Spring Meeting, Mar. 19–23, 1995.

*Primary Examiner*—Eggerton A. Campbell
*Attorney, Agent, or Firm*—Buchanan Ingersoll, P.C.

[57] ABSTRACT

The inner surface of ethylene furnace tubes is diffusion coated with a sufficient amount of chromium or chromium and silicon to form a first coating having a thickness of at least two mils. This coating is then cleaned, neutralized, and grit blasted. Then a second coating of a sufficient amount of aluminum or aluminum and silicon is diffused onto the first coating to form a total coating thickness of at least five mils. The surface of the second coating is cleaned and polished to remove the nickel and iron-rich overlay which is present as a result of the coating process and to provide a smooth uniform surface. When ethelyene is produced using furnace tubes which are coated in this manner less coking occurs.

20 Claims, 1 Drawing Sheet

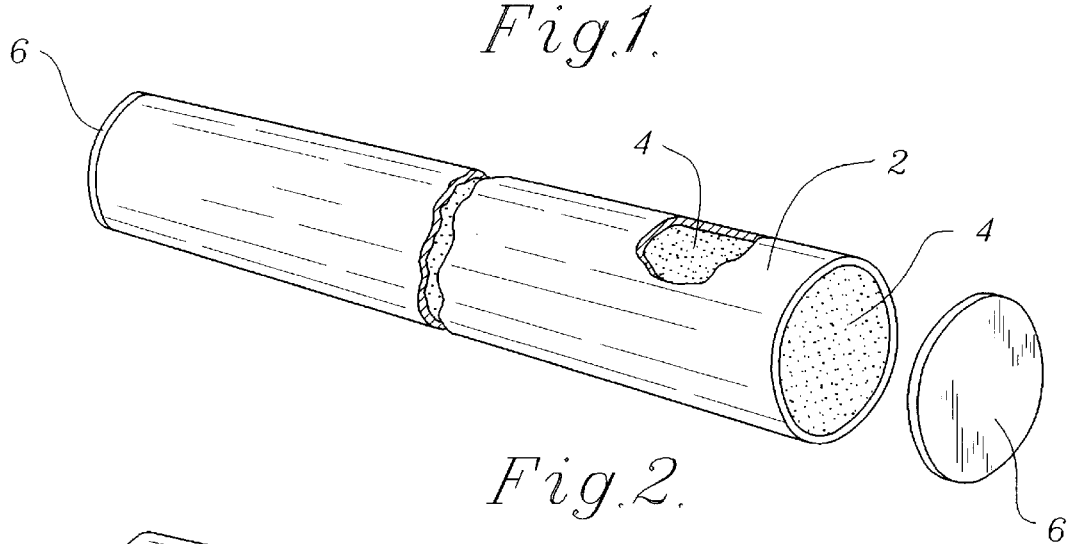
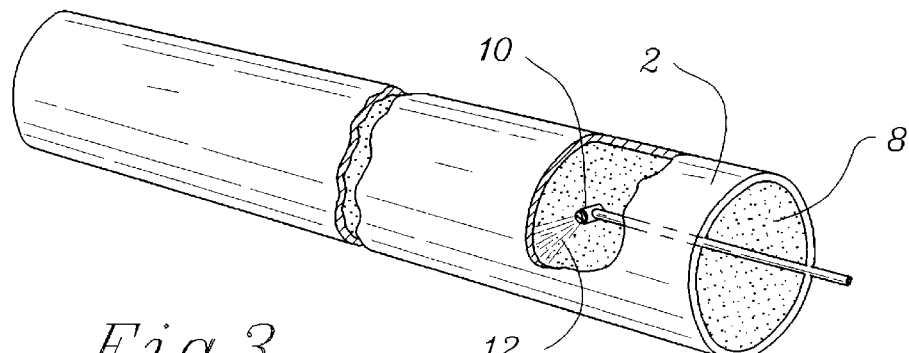
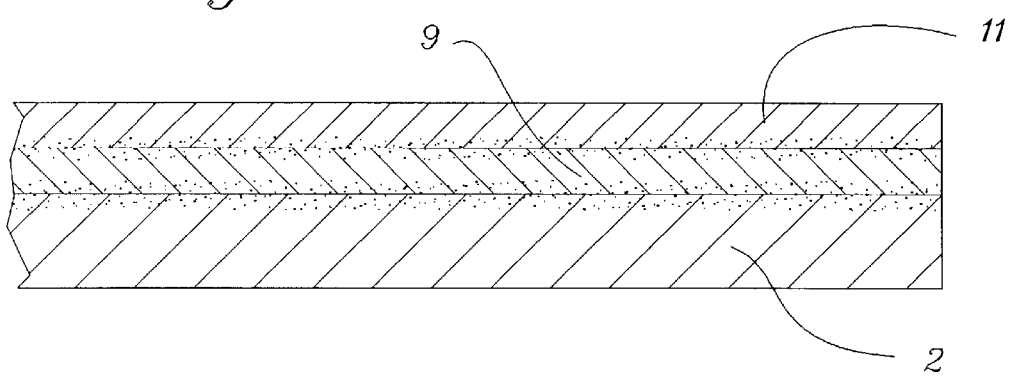
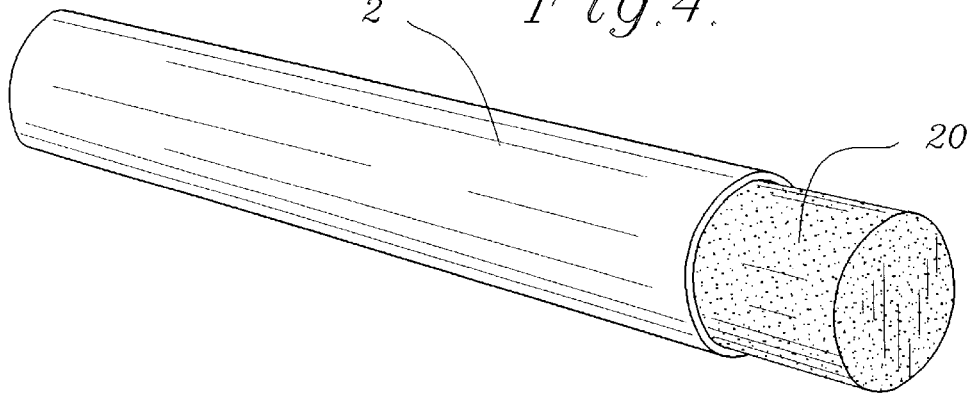

DIFFUSION COATED ETHYLENE FURNACE TUBES

FIELD OF INVENTION

The invention relates to a chromium-aluminum-silicon containing coating diffused onto the surface of steel and superalloys to provide improved resistance to corrosion.

BACKGROUND OF THE INVENTION

Ethylene is produced by passing a feedstock containing naphtha and other distillates through a furnace comprised of a series of tubes. To achieve desired creep strength and oxidation resistance, these tubes are made of higher alloys such as the wrought Alloy 800 series and centrifugally cast alloys such as HP, HK, and HH alloys. The feedstock enters the furnace at a temperature of about 1000° F. where it is heated to about 1650° F. During the process pyrolytic coke is produced. Some of the coke accumulates on the walls of the furnace tubes. Nickel in the tubes reacts with the coke to form long whisker-like structures that extend from the walls of the tubes called catalytic coke. These strands tend to catch pyrolytic coke passing through the tubes to form a complex amorphous coke coating on the inner wall of the furnace tubes. This coating acts as an insulator reducing the temperature of the inner walls of the furnace tubes. Consequently, the furnace must be periodically cleaned to remove this coating. This cleaning is often called decoking. At many locations the tubes must be cleaned every six weeks.

The art has attempted to control catalytic coking by the selection of high chromium, high silicon content alloys or by applying a chromium or aluminum or ceramic coating to the inner walls of the furnace tube. However, higher chromium introduces instability in the alloy structures. Aluminum coatings have found limited success on wrought alloys with process temperatures not exceeding 1600° F. At higher temperatures inter-diffusion and spalling occurs. Ceramic coatings suffer from cracking and spalling.

Coatings of two or more materials have also been proposed for metals used in high temperature process applications. In Japanese Patent 80029151 there is disclosed a method for applying a chromium-aluminum-silicon coating. This coating is produced by a chromium pack cementation process followed by an aluminum-silicon pack cementation process. The coated metal is said to be useful for jet engines, gas turbines and internal combustion engines. In U.S. Pat. No. 3,365,327 there is disclosed a method for vapor diffusion coating metallic articles with aluminum-chromium-silicon to provide elevated temperature corrosion resistance for gas turbine and oil refinery applications. In U.S. Pat. Nos. and 4,500,364 and 4,310,574 there are disclosed methods for applying an aluminum-silicon coating for high temperature process applications. The technique involves a slurry coating followed by high temperature firing. There is no teaching in any of these references that such coatings would be useful for ethylene furnace tubes.

Pack cementation is a well known technique for applying diffusion coatings to metal surfaces. This process involves placing a pack mixture into close contact with the surface being coated and subsequently heating the entire assembly to an elevated temperature for a specified period of time. During heating the coating material diffuses from the pack onto the surface of the metal. A common pack mixture used to create a chromium coating contains chromium, an inert filler such as alumina, and a halide activator such as ammonium chloride. The pack cementation process is particularly useful for coating inner walls of tubular structures. However, prior to the present invention the art has not created a pack cementation process that significantly reduced the formation of catalytic coke deposits on the inner walls of ethylene furnace tubes.

The art has also proposed co-diffusing chromium and silicon, chromium and aluminum, or aluminum and silicon in a single step pack cementation process. These methods have several disadvantages including difficulty in obtaining process control of the diffusion coating composition and nonuniform diffusion coating thickness on large scale due to pack heat transfer limitations. Due to the temperature gradients found in large powder packed retort, laboratory processes are usually difficult to scale-up to commercial processes in a manner which provides for diffusion coating thickness and composition uniformity on large components.

Whenever a metal alloy containing nickel, chrome and iron is coated using a diffusion process, a nickel and iron-rich overlay is formed on the coating. In the past no effort was made to remove this overlay. However, we have discovered that the overlay promotes coking when present on ethylene furnace tubes.

Consequently, there is a need for a effective method of treating high alloy ethylene furnace tubes to reduce catalytic coking.

SUMMARY OF THE INVENTION

We provide a method of coating the inner surface of ethylene furnace tubes in which we diffuse a sufficient amount of chromium or chromium and silicon into the inner surface of the tube to form a first coating having a thickness of at least two mils. This coating surface is then cleaned, neutralized, and grit blasted. Then we diffuse a sufficient amount of aluminum or aluminum and silicon onto the first coating to form a second coating having an overall two stage coating thickness of at least five mils. Finally we clean and polish the second coating removing the nickel and iron-rich overlay and providing a smooth uniform surface. The coatings are preferably applied using pack cementation or thermal spray diffusion. Other embodiments to transport and apply the coating elements to the tube surface include ceramic composite inserts and gels.

BRIEF DESCRIPTION OF THE FIGURES

FIG. 1 is a perspective view partially cut away of a furnace tube containing a pack for applying a first coating in accordance with a first preferred embodiment;

FIG. 2 is a perspective view similar to FIG. 1 showing application of the second coating in accordance with the first preferred embodiment;

FIG. 3 is a cross sectional view of a portion of a furnace tube to which our coating has been applied; and FIG. 4 is a perspective view showing an alternative method of applying our coating to a furnace tube.

DESCRIPTION OF THE PREFERRED EMBODIMENTS

We provide improved ethylene furnace tubes and pipes which will reduce pyrolytic coking and reduce decoking times in ethylene furnaces. These tubes and pipes are provided with a diffusion coating on their inner wall. The diffusion coating is applied in two stages. Referring to FIG. 1 we illustrate a furnace tube or pipe 2 which can be of any desired length and may include both straight portions and return bends. The tube is filled with a pack mix composition 4 containing chromium or chromium and silicon along with a binder such as aluminum oxide and an activator such as ammonium chloride. Caps 6 are placed on either end of the tube. The capped tube is then heated in a retort furnace at a sufficiently high temperature and time to form a chromium or chromium-silicon coating on inner surface of the tube 2.

After the diffusion coating has cooled sufficiently we thoroughly clean, neutralize and grit blast the coating. This provides a first coating surface which is receptive to the second stage coating. The second stage coating is either a diffusion coating of aluminum alone or of an aluminum silicon combination. As shown in FIG. 2, we provide the pipe 2 which has an inner surface 8 containing the chromium or chromium-silicon coating indicated by the dotted surface shading. A diffusion spray head 10 is inserted into the tube. This head provides a thermal spray 12 of aluminum or an aluminum silicon combination. The spray forms the second coating over the first coating. In FIG. 3 we show a cross-section of the coated tube. The pipe 2 has a first coating layer 9 of chromium or chromium and silicon. This coating should be at least 2 mils in thickness. On top of the first coating 9 there is a second coating of aluminum alone or an aluminum silicon combination 11. Layer 11 should also have a thickness of at least 2 mils. We further prefer that the combined thickness of the first coating and the second coating be at least 5 mils. Following application of the final layer 11 the inner surface is polished to remove the nickel and iron-rich overlay and thereby minimize nucleation sites for coke deposition. Welding together of the tubes is accomplished using special bevel preparation and typical weld wire and purge techniques historically used for ethylene furnace tube fabrication. We have found that ethylene furnace tubes coated in accordance with the present invention have significantly less catalytic coking.

For purposes of illustration in FIG. 3 we show two distinct layers 9 and 11 of uniform thickness. It will be understood by those skilled in the art that some diffusion will occur between layers to create a strong bond.

For the first stage coating, we created a chromium diffusion coating of about 5 mils thickness on cleaned and grit blasted HP-40 Nb (Niobium) modified cast alloy tubes using a pack mix composition of 48 wt. % chromium, 4 wt. % ammonium chloride, and 48 wt. % aluminum oxide. This pack was placed in the tubes, which were sealed in a retort, and heated at 2200° F. for 10 hours under an inert argon atmosphere. The tubes surfaces were then neutralized with a pH 12 alkaline solution, cleaned and grit blasted. For the second stage coating, we arc-wire thermal sprayed the chromized tubes surfaces with 5 to 7 mils of an alloy composed of 88 wt. % aluminum and 12 wt. % silicon. The resulting coated HP-40 coated tubes were diffusion heat treated under an inert argon atmosphere at 2000° F. for 3 hours. Upon completion of the diffusion heat treatment, the tubes were cleaned and grit blasted.

Metallographic evaluation of a chromium-aluminum-silicon diffusion coated HP-40 Nb modified cast alloy tube revealed an average coating thickness of 15 mils as determined by optical microscopy, with a composition including 75 wt. % chromium, 2 wt. % aluminum, and 17 wt. % silicon at the surface, as determined by scanning electron microscopy/energy dispersive spectrometry. Five mils into the coating, the composition shifted to 10 wt. % chromium, 26 wt. % aluminum, and 2 wt. % silicon. The nominal base alloy composition was reached at a depth of 18 mils below the coating surface.

Thermal cycling experiments were conducted on the chromium-aluminum-silicon diffusion coating HP-40 Nb modified tubes. These experiments involved heating in an air atmosphere furnace from room temperature to 1850° F. at a rate of 9° F./minute, holding at 1850° F. for two hours, and then cooling down overnight by switching off the furnace. A total of 60 cycles were conducted.

The samples were weighed initially and after about every five cycles, and also at the end of the testing. They were also visually examined for signs of flaking, discoloration, spalling, etc. Small sections from as-coated and thermally cycled test specimens were examined with optical and scanning electron microscopes.

No spalling or internal oxidation of the chromium-aluminum-silicon diffusion coating on the HP-40 Nb modified substrate occurred, which often occurs when only aluminum or aluminum-silicon is diffused and is subjected to severe thermal cycling. The integrity of the diffusion coating was exceptional. Some interdiffusion (continued diffusion) of the coating elements occurred. After the 60 thermal cycles, the diffusion zone thickness was increased by 5 to 10 percent, or one mil.

As an alternative to a pack mix, a ceramic or metal composite insert can be used. As shown in FIG. 4, this insert 20 is placed within tube 2. The tube is then capped or taped and heated at an elevated temperature for a period of time to form the diffusion coating. The composite insert will contain selected proportions of chromium-silicon or aluminum-silicon with an activator, inert filler and binder. After the tube 22 containing the insert 20 is heated for a sufficient period of time to form the desired diffusion coating, the tube is cooled and the insert 20 is removed. Thereafter, the coating is cleaned neutralized and grit blasted. The second coating containing aluminum or an aluminum silicon combination is then applied. This second coating can be applied using spray deposition as shown in FIG. 2, or pack cementation or using a composite insert or gel.

The present method is useful for both cast and wrought furnace tubes and pipes. Our test revealed that ethylene furnace tubes coated in accordance with the present method resist catalytic coking better than other coated tubes currently in use. We attribute this performance to the fact that our coating and process for applying the coating minimizes the nickel and iron present on the surface of the tube.

While we have described and illustrated certain present preferred embodiments of our methods for diffusion coating ethylene furnace tubes, it should be distinctly understood that our invention is not limited thereto, but may be variously embodied within the scope of following claims.

We claim:

1. A method of coating a surface of ethylene furnace tubes formed from a metal alloy containing nickel, chrome and iron comprising:
   a. diffusing a sufficient amount of chromium onto the surface to form a first coating having a thickness of at least two mils;
   b. cleaning the first coating;
   c. roughening the first coating;
   d. diffusing a sufficient amount of aluminum onto the first coating to form a second coating of aluminum having a thickness of at least two mils and a nickel and iron-rich overlay; and
   e. polishing the second coating to remove the nickel and iron-rich overlay.

2. The method of claim 1 wherein the first coating and the second coating have a combined thickness of at least 5 mils.

3. The method of claim 1 also comprising the step of co-diffusing silicon with chromium to form the first coating.

4. The method of claim 1 also comprising the step of co-diffusing silicon with aluminum to form the second coating.

5. The method of claim 1 wherein at least one of the first coating and the second coating are applied by a surface chemical diffusion process.

6. The method of claim 5 wherein the surface chemical diffusion process is pack cementation.

7. The method of claim 1 wherein at least one of the first coating and the second coating are applied by thermal spraying.

8. The method of claim 1 wherein the surface is an inner wall of a tube and at least one of the first coating and the second coating are applied by:
   a. placing a pack mix containing at least one of chromium and aluminum in the tube:
   b. closing both ends of the tube; and
   c. heating the tube to an elevated temperature for a sufficient time to create a diffusion coating on the inner wall.

9. The method of claim 1 wherein the surface is an inner wall of a tube and at least one of the first coating and the second coating are applied by:
   a. placing in the tube an insert formed from a composite of:
      one of a metal and a ceramic,
      at least one coating material selected from the group consisting of aluminum, chromium and silicon,
      an activator,
      a filler, and
      a binder;
   b. closing both ends of the tube; and
   c. heating the tube to an elevated temperature for a sufficient time to create a diffusion coating on the inner wall.

10. The method of claim 1 wherein the roughening of the first coating is achieved by grit blasting.

11. An improved tube for ethylene furnaces comprised of a tubular member formed from an alloy containing nickel, chromium and iron and a coating on an inner surface of the tubular member, the coating formed by the steps of:
    a. diffusing a sufficient amount of chromium onto the inner surface to form a first coating having a thickness of at least two mils;
    b. cleaning the first coating;
    c. roughening the first coating;
    d. diffusing a sufficient amount of aluminum onto the first coating to form a second coating of aluminum having a thickness of at least two mils and a nickel and iron-rich overlay; and
    e. polishing the second coating to remove the nickel and iron-rich overlay.

12. The improved tube of claim 11 wherein the first coating and the second coating have a combined thickness of at least 5 mils.

13. The improved tube of claim 11 wherein silicon is co-diffused with chromium to form the first coating.

14. The improved tube of claim 11 wherein silicon is co-diffused with aluminum to form the second coating.

15. The improved tube of claim 11 wherein the roughening of the first coating is achieved by grit blasting.

16. An improved ethylene furnace of the type comprised of a plurality of tubes formed from an alloy containing nickel, chromium and iron, and in which feed stock is passed and heated wherein the improvement comprises a coating on an inner surface of at least one of the tubes, the coating formed by the steps of:
    a. diffusing a sufficient amount of chromium onto the inner surface to form a first coating having a thickness of at least two mils;
    b. cleaning the first coating;
    c. roughening the first coating;
    d. diffusing a sufficient amount of aluminum onto the first coating to form a second coating of aluminum having a thickness of at least two mils and a nickel and iron-rich overlay; and
    e. polishing the second coating to remove the nickel and iron-rich overlay.

17. The improved ethylene furnace of claim 16 wherein the first coating and the second coating have a combined thickness of at least 5 mils.

18. The improved ethylene furnace of claim 16 wherein silicon is co-diffused with chromium to form the first coating.

19. The improved ethylene furnace of claim 16 wherein silicon is co-diffused with aluminum to form the second coating.

20. The improved ethylene furnace of claim 16 wherein the roughening of the first coating is achieved by grit blasting.

* * * * *